United States Patent
Määttä

(10) Patent No.: US 6,295,726 B1
(45) Date of Patent: Oct. 2, 2001

(54) METHOD OF MANUFACTURING SURFACE-MOUNTABLE SIL HYBRID CIRCUIT

(75) Inventor: Hannu Määttä, Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/485,338

(22) PCT Filed: Aug. 10, 1998

(86) PCT No.: PCT/FI98/00622

§ 371 Date: Feb. 8, 2000

§ 102(e) Date: Feb. 8, 2000

(87) PCT Pub. No.: WO99/08495

PCT Pub. Date: Feb. 18, 1999

(30) Foreign Application Priority Data

Aug. 8, 1997 (FI) .................................. 973268

(51) Int. Cl.[7] .................................................. H01R 43/00
(52) U.S. Cl. ............................. 29/827; 29/874; 439/83; 439/876
(58) Field of Search ................... 29/827, 874, 882; 439/83, 876

(56) References Cited

U.S. PATENT DOCUMENTS

| | | | |
|---|---|---|---|
| 3,873,890 | * | 3/1975 | Beckman et al. . |
| 4,127,934 | * | 12/1978 | Bartley et al. . |
| 4,978,307 | | 12/1990 | Billman et al. . |
| 5,352,851 | | 10/1994 | Wallace et al. . |
| 5,441,430 | * | 8/1995 | Seidler . |
| 5,490,788 | * | 2/1996 | Mazzochette . |
| 5,635,760 | | 6/1997 | Ishikawa . |

FOREIGN PATENT DOCUMENTS

| | | |
|---|---|---|
| 682 366 | 11/1995 | (EP) . |
| 42 43 155 | 8/1992 | (JP) . |

* cited by examiner

Primary Examiner—Carl J. Arbes
(74) Attorney, Agent, or Firm—Pillsbury Winthrop LLP

(57) ABSTRACT

A method for manufacturing a SIL hybrid circuit is presented. A lead frame is provided which includes side bands and clip members between the side bands configured to connectively receive a hybrid circuit. The lead frame further includes foot members between the side bands configured to be surface-mounted to a base substrate. Each foot member has tabs at the ends thereof and support members extending straight from the tabs to connect the tabs to the side bands. Corresponding contact areas of the hybrid circuit are attached to the clip members. At least one foot member and associated support members are selected to remain in the lead frame to support the SIL hybrid circuit during positioning on the base substrate and surface mounting thereto. Excess parts are removed from the lead frame based on the selecting. As such, SIL hybrid circuits may be efficiently used to achieve high packaging densities.

9 Claims, 4 Drawing Sheets

METHOD OF MANUFACTURING SURFACE-MOUNTABLE SIL HYBRID CIRCUIT

This application is the national phase of international application PCT/FI98/00622 filed Aug. 10, 1998 which designated the U.S.

The invention is related to a method of manufacturing surface-mountable SIL hybrid circuits, and, especially, to the manufacturing phase in which the SIL hybrid circuits are provided with external contacting leads by means of a lead frame. The invention relates also to mounting of SIL hybrid circuits on a base substrate, e. g. a printed circuit board, by means of surface mounting techniques.

Even in the past decade hybrid circuits were used widely in the electronic equipment because by using hybrid circuits the packaging density was increased in relation to a technique in which mainly separate components provided with contact terminals were mounted directly on a printed circuit board. It is obvious that packaging density is most easily increased by using SIL hybrid circuits (SIL, single in-line), i. e. edge-mountable hybrid circuits, the conventional packaging technology of which is illustrated in FIG. 1. One edge of a SIL hybrid circuit 1 is provided with contact areas 7, 7'. The leads 3, 4, which are to be connected to the contact areas, are arranged to form a continuing lead frame 2, and they are connected, usually by soldering, without separating them from the frame. In FIG. 1, this is shown as a front view (above left) and as a side view (above right). After connection of the leads, the side bands 5, 6 holding the frame together are removed, and the leads 3 connected to the contact areas 7, 7' by means of the clip parts 4a, 4b remain at the edge of the hybrid circuit 1. Below left in FIG. 1, mounting of the hybrid circuit separated from the frame 2 on a circuit board 11 is shown schematically. The holes 12 which receive the leads 3 of the hybrid circuit are plated through holes for making the solder joints reliable.

Today the packaging technology of electronic equipment often includes multilayer circuit boards and surface mounted components on both sides of the circuit board. There are several reasons which make the SIL hybrid technology described above not very suitable for present packaging technology. Firstly, the borings necessary in the circuit board reduce the area available for inner circuit layers. Secondly, instead of wave soldering normally used when mounting components to plated through holes, reflow soldering methods, which are more suitable for surface mounting, are used in the present packaging technology. In the wave soldering process the components on the lower side of the circuit board are immersed in the liquid solder, whereby the thermal shock may damage them. If hybrid circuits are used, they are often mounted separately and soldered manually to avoid reliability risks.

The use of hybrid circuits in electronic equipment is remarkably reduced also because a high enough packaging density is achieved by mounting small size surface-mount components directly on a multilayer circuit board. In the design of many electronic devices it is, however, still desirable to improve packaging density, and by means of SIL hybrid circuits it would be possible. Only a new advantageous solution, suitable for the present packaging technology, for mounting SIL hybrid circuits on printed circuit boards is needed. An object of the invention is to provide such a solution.

According to the invention, a method of manufacturing SIL hybrid circuits with terminal leads (legs):

a lead frame is manufactured including side bands and between the side bands several members including a clip member for making a joint to a hybrid circuit and a foot member for surface-mount to a base substrate, e. g. a printed circuit board;

a hybrid circuit is attached to the clip members of the lead frame by means of the corresponding contact areas; and excessive parts are removed from the lead frame so that the clip members attached to said contact areas and the corresponding foot members are left, wherein the lead frame is manufactured and/or the excessive parts are removed therefrom so that one or more support members are left with respect to one SIL hybrid circuit for supporting the same during positioning and surface mounting to a base substrate.

In accordance with a preferred embodiment of the invention the lead frame is manufactured to include strip-like members connecting the foot members to the side band so that at least one strip-like member may be left as a support member with respect to one hybrid circuit during the removing of the excessive parts.

In accordance with another preferred embodiment of the invention strip-like members are left which extend from a foot member to both sides of the SIL hybrid circuit. The strip-like member left as the support member may be bent towards the base substrate for the purpose that, during mounting the SIL hybrid circuit, it is positioned into a corresponding hole formed in the base substrate. The bent part of the strip-like member may also be twisted around the longitudinal axle thereof, whereby the bent parts twisted to different directions improve the alignment of the hybrid circuit.

In accordance with a further embodiment of the invention the location of the support member to be left is selected with respect to any SIL hybrid circuit to be advantageous with respect to the mounting, so that, for example, in the mounting of the SIL hybrid circuit on the base substrate the position of the support member is different from the positions of the support members of the adjacent hybrid circuits.

The method according to the invention makes possible to utilize SIL hybrid circuits efficiently in surface-mount based assembly of electronic equipment. The circuits may be mounted by automatic mounting machines, and they are well enough supported so as to remain stationary during reflow soldering.

The invention and some embodiments thereof are described in further detail in the following with reference to the accompanying drawings, wherein:

FIG. 1 presents a prior art manufacturing method and use of SIL hybrid circuits;

FIG. 2 presents an embodiment of a lead frame and illustrates final stages of manufacturing a SIL hybrid circuit wherein external contacting leads are attached thereto;

FIG. 3 shows a top plan view (above) and a side view (below) of the SIL hybrid circuit manufactured in accordance with the method of the invention illustrated in FIG. 2;

FIGS. 4(a) and 4(b) show sectional side views of the hybrid circuit of FIG. 3 along lines A—A and B—B, respectively;

FIG. 5 presents a schematical and enlarged side view of the SIL hybrid circuit of FIG. 2 positioned for surface mounting;

FIGS. 6(a) and 6(b) show enlarged views of contacting leads (legs) and support members of FIGS. 4(a) and 4(b) and show also schematically the mounting of the SIL hybrid circuit on a printed circuit board;

The prior art of the manufacturing of SIL hybrid circuits is described above in the introductory part of the description.

Figure 1:
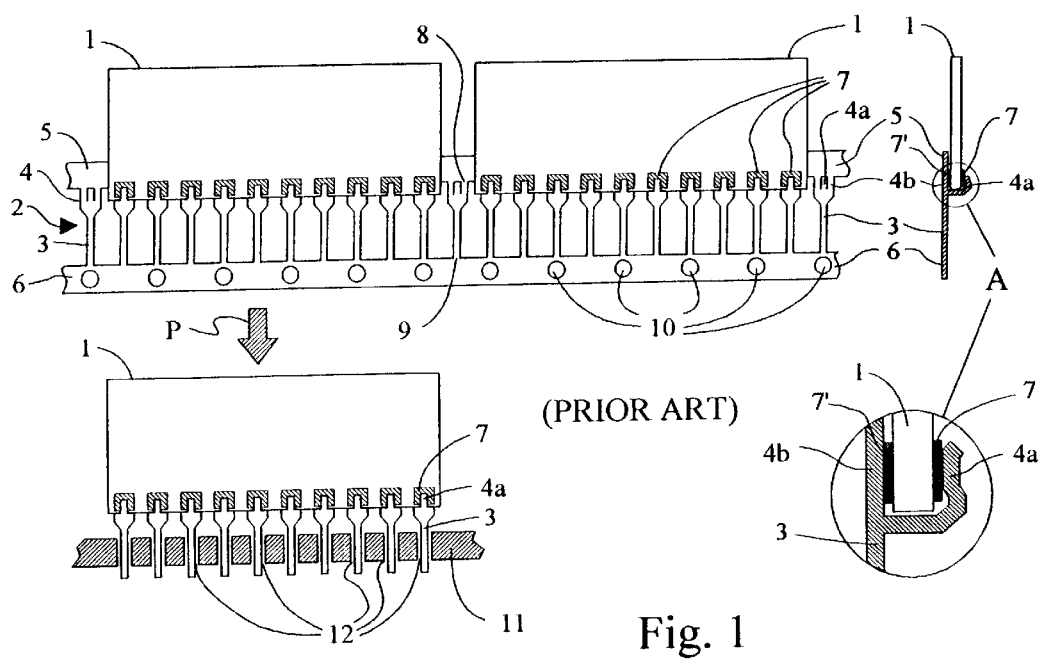
Figure 2:
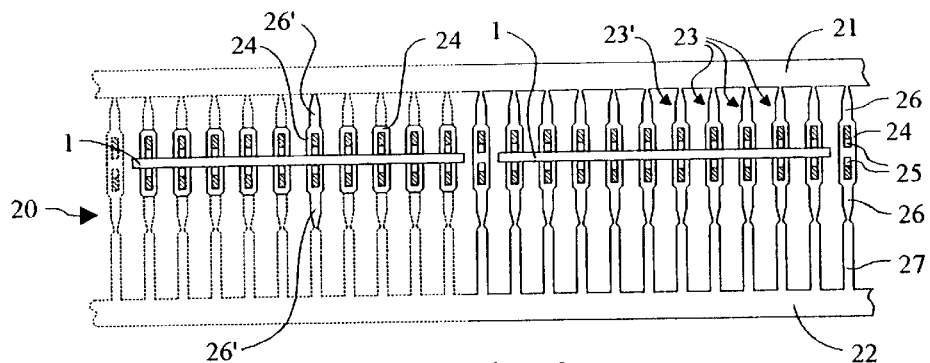
Figures 3, 4A, 4B:
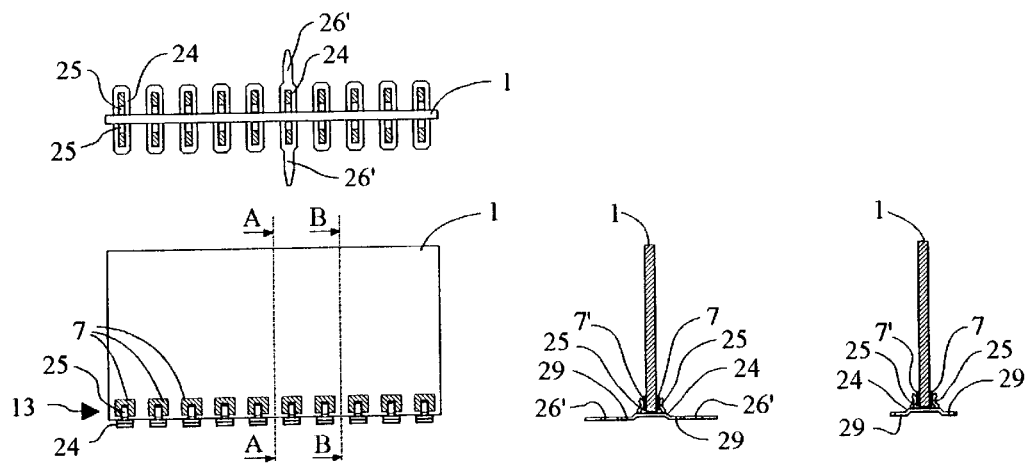

FIG. 2 presents a schematical plan view of a lead frame 20 and hybrid circuits 1 connected thereto. FIGS. 3, 4(*a*), and 4(*b*) present a side view and a sectional view of one of the hybrid circuits 1 after removing the excessive parts of the lead frame. A lead frame 20 includes side bands 21 and 22 and members 23, 23' therebetween which include a clip member 25 for connecting the hybrid circuit thereto, and a foot member 24 for surface mounting and connecting a contacting lead, connected to the hybrid circuit by a clip member, to a base substrate, usually a printed circuit board. The clip member 25 forms a slot to which the edge 13 of the hybrid circuit 1 is tightly fitted so that the arms of the clip member are set against the contact areas 7, 7' and may be connected thereto by soldering or other suitable manner. The side bands 21 and 22 are usually provided with perforations (not illustrated) which are at a certain distance from each other for the purposes of mechanical handling. Besides the clip members 25 and foot members 24, the members 23, 23' between the side bands include strip-like members 26 at both sides of the foot member and a further strip-like member 27 adjacent to the side band 22. At the left in FIG. 2 the excessive parts to be removed from the lead frame are illustrated by a broken line, and the parts which remain as contacting leads or other parts in the hybrid circuit are illustrated by a solid line. In the example of FIGS. 2–4 the strip-like members 26' extending to both sides from the foot member 24 are left as support members at the sixth contacting lead from the left. The meaning of the support members 26' is illustrated by sectional views 4(*a*) and 4(*b*). A normal foot member (FIG. 4(*b*)) has tabs 29 at both sides of the hybrid circuit, the tabs being set against the base substrate for making an electrical and mechanical connection between the leg member and a corresponding contact area on the base substrate. Normally, the base substrate is a printed circuit board to which the connection is made by some reflow soldering method. The support members 26' (FIG. 4(*a*)) have a significant stabilizing effect to a hybrid circuit 1 placed on a base substrate, and they confirm that the circuit is standing and keeps the position thereof during handling and soldering.

Figure 5:
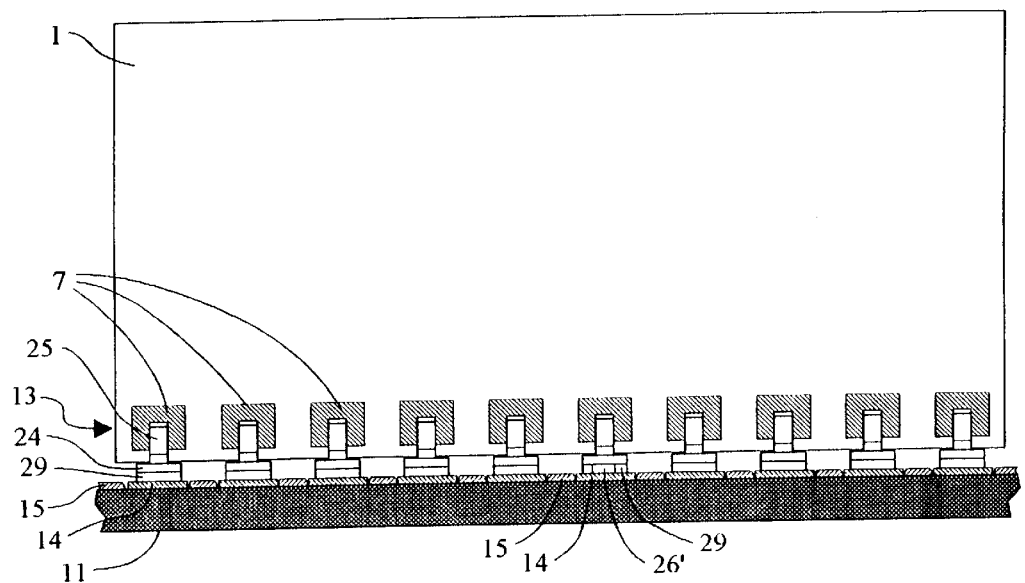
Figures 6A, 6B:
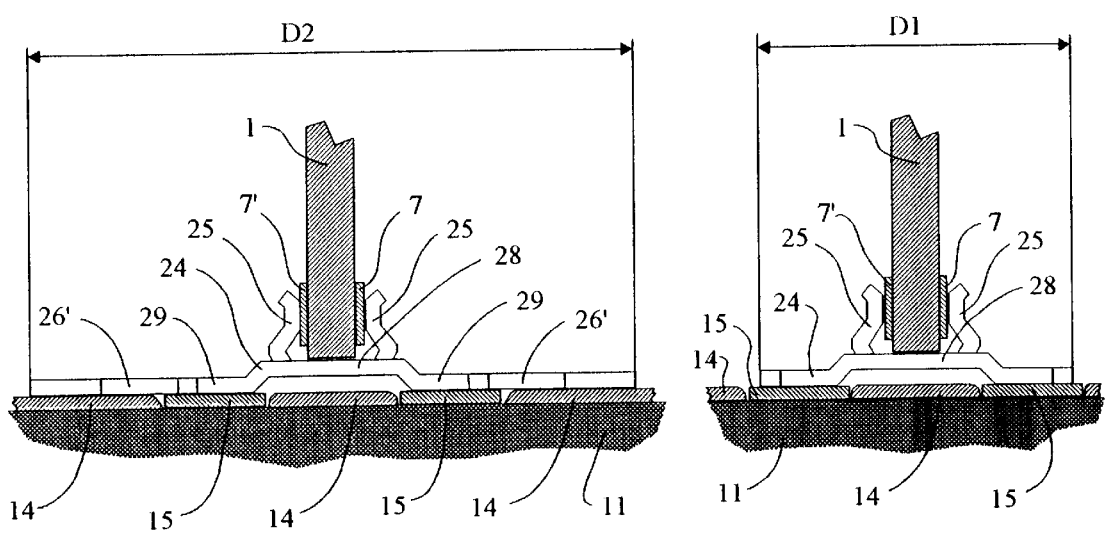
Figure 7:
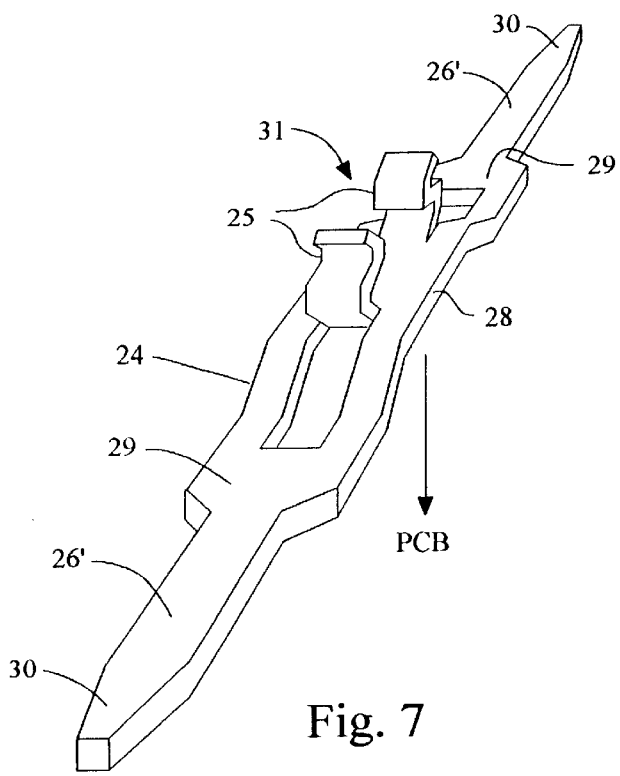
FIGS. 7 and 8 show perspective views of a contacting lead (leg) cut from the lead frame with a support member and without a support member, respectively.

FIGS. 5, 6(*a*) and 6(*b*) present schematically, in enlarged size and in more detail the mounting of the hybrid circuit on the printed circuit board and the structure and meaning of the support members. The printed circuit board has corresponding contact areas 15 for the tabs 29 of the foot members 24. Around the contact areas the printed circuit board is covered by conventional protective coating 14 on which the support members 26' are extending. In this phase, the clip members are already attached by soldering to the corresponding contact areas 7, 7' of the hybrid circuit. Contact areas 15 and tabs 29 may have a tin-coating for soldering, or there may be solder paste printed on the contact areas for soldering. The soldering may be made by focus-technique, for example.

Figure 8:
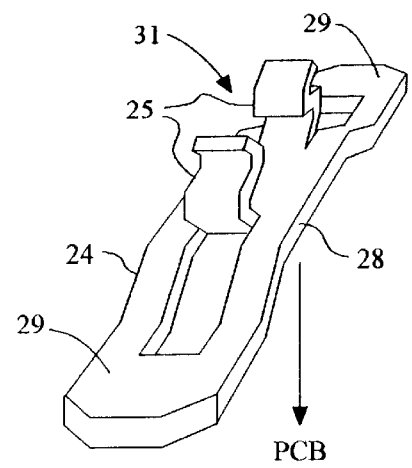
Figure 9:
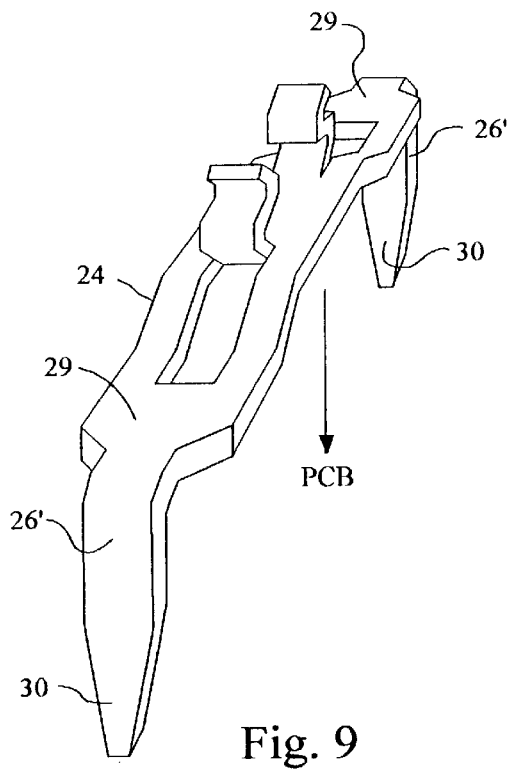
FIGS. 9 and 10 show some embodiments of a contacting lead (leg) with a support member and embodiments in which the strip-like members, functioning as support members, are bent towards the base substrate for positioning into the holes in the base substrate.
Figure 10:
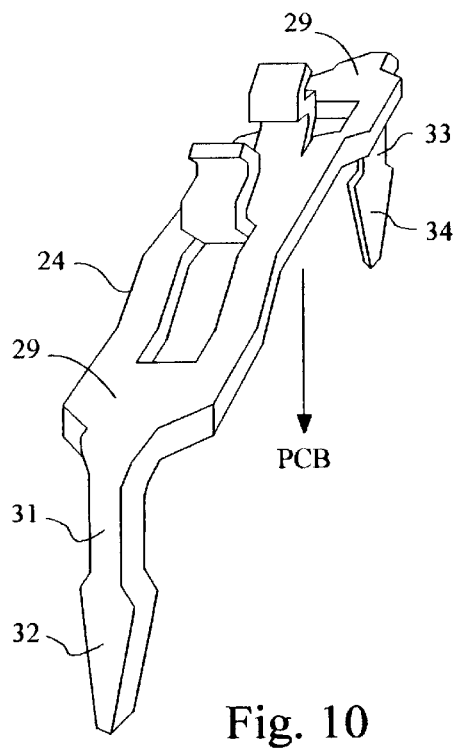

FIGS. 7–10 show in more detail some possible structures of the contacting leads and support members. FIG. 8 presents a contacting lead separated from the lead frame and with no support member. The clip member is formed by arms 25 cut out from the foot member 24 and bent suitably to form a slot 31 for the edge of the hybrid circuit. The foot member 24 could be straight, too, but the form shown in the figures in which there are tabs 29 at both ends of the foot member, which are at a little lower level than the center part 28, is more advantageous as far as soldering is concerned. It makes possible also to draw conductors on the printed circuit board between the contact areas 15. The support members 26', 30 may be left to extend straight to both sides from the foot member 24 so that they, while resting against the printed circuit board, normally the protective coating thereof, support the hybrid circuit. In the embodiment of FIG. 9, the support members 26', 30 are bent to extend at an essentially right angle towards the base substrate. In the base substrate, corresponding holes are formed for receiving the support members. It is not necessary to attach the support members to the holes by soldering, and so the holes must not be of plated through type. It is clear that a hybrid circuit supported in this way keeps its position during the handling after placing even better than when supported by support members extending to the sides only. This solution may be advantageous also in relation to the space utilization of a printed circuit board though the holes always take some space away from routing conductors on the surface or in the inner layers of the printed circuit board. FIG. 10 shows an embodiment in which the support members 31, 32 and 33, 34 are formed so that they provide gripping to the holes to which the peak parts 32, 34 are tightly fitted. Moreover, the support members 31, 33 are twisted about 45° around the longitudinal axis thereof in different directions by means of which free motion of the support members 31, 33 fitted to the holes is further reduced and the alignment of the hybrid circuit mounted on the printed circuit board is further improved.

Figure 11:
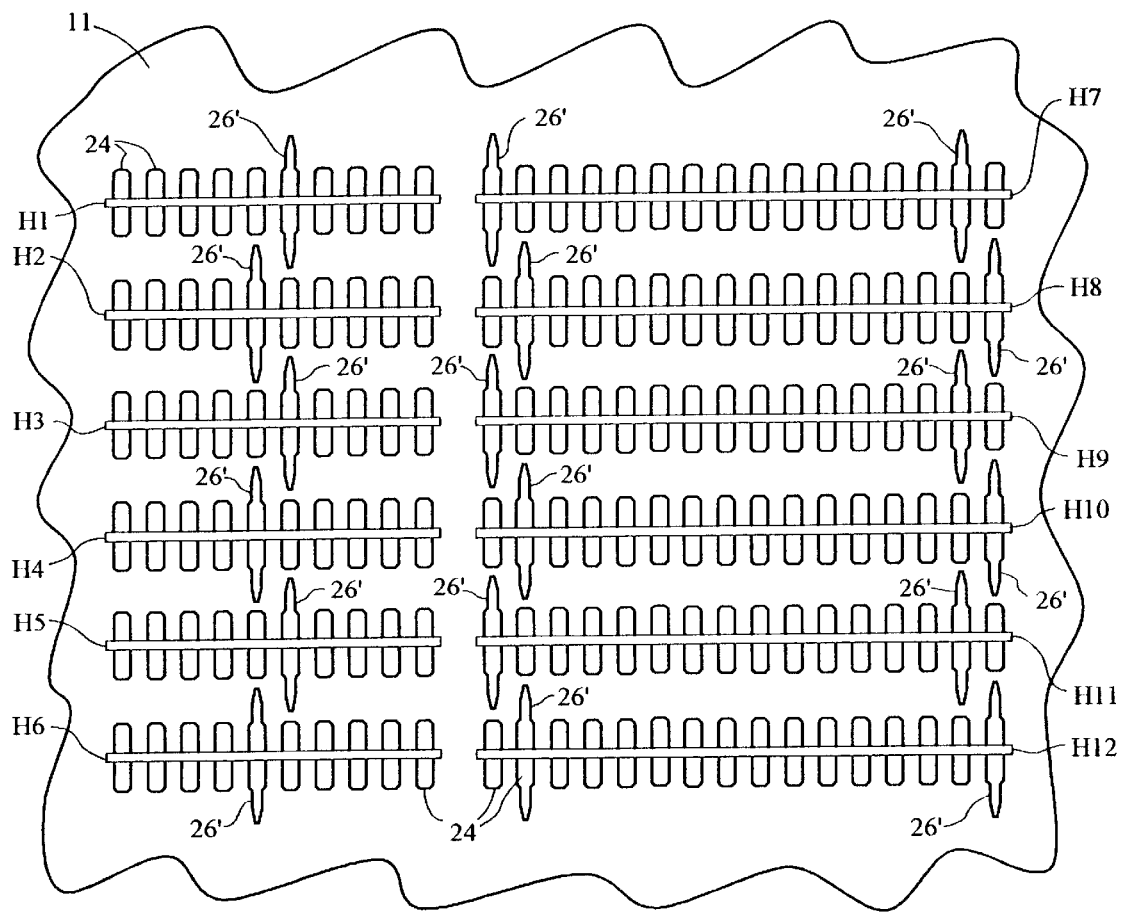
FIG. 11 shows schematically an embodiment of the method of the invention.

FIG. 11 shows schematically hybrid circuits H1 . . . H2 which are mounted on a base substrate, e. g. printed circuit board, the hybrid circuits being manufactured according to the present invention. For the sake of clarity, and as it is not necessary for describing the invention, no contact areas, conductors or other components are shown on the base substrate. As shown in the figure, the support members 26' are selected to be situated in the middle area in SIL hybrid circuits H1 . . . H6 and, moreover, so that the support member 26' is laterally aligned not with the corresponding support member 26' but with a foot member 24 of the adjacent hybrid circuit. In longer SIL hybrid circuits H7 . . . H12 a support member 26' is situated at both ends of the circuit for keeping the circuit more accurately at the aimed position during mounting. Also in hybrids H7 . . . H12 the situation of the support members 26' in different circuits is selected so that they are not laterally aligned in hybrid circuits which are side by side.

In conventional hybrid circuit technology the substrate is of aluminum oxide and the normal thickness thereof is about 0.6 mm, and the lead frame is made of phosphor-bronze, the thickness thereof is typically about 0.25 mm, and it is often plated with a conventional tin-lead coating for soldering purposes. It is clear that the method according to the invention is not restricted to above mentioned materials. The invention may as well be applied to hybrid circuit technology utilizing more or less polymer based materials. The method of the invention is not restricted to soldering as a connection method either, but it may be applied also when the connections are made by conductive adhesives, for example. Furthermore, the invention is not restricted to support member solutions described above. As far as manufacturing of the lead frame is concerned and also for other reasons, it is practical that support members which are to be left in a hybrid circuit are in connection with foot members, but it is clear that support members may be included in a lead frame also in other ways, like separate members with no leads in connection therewith for mechanical and electrical connection, for example. Normally, one support member or a couple of them is enough for one hybrid circuit, but if a hybrid circuit is very long, for example, two pairs of support members may be left for one hybrid circuit.

The invention may vary within the scope of the accompanying claims.

What is claimed is:

1. A method for manufacturing a SIL hybrid circuit comprising:

providing a lead frame, the lead frame including side bands and clip members between the side bands configured to connectively receive a hybrid circuit, the hybrid circuit having contact areas corresponding to the clip members, the lead frame further including foot members between the side bands configured to be surface-mounted to a base substrate, each foot member having corresponding clip members and having tabs at the ends thereof, the tabs being configured to be set against the base substrate, each foot member further having support members extending straight from the tabs and within the same plane as the tabs to connect the tabs to the side bands;

attaching the corresponding contact areas of the hybrid circuit to the clip members, wherein each foot member is substantially perpendicular to the hybrid circuit;

selecting at least one foot member and associated support members to remain in the lead frame, the at least one foot member and associated support members being configured to support the SIL hybrid circuit during positioning on the base substrate and surface mounting thereto; and removing, based on the selecting, excess parts from the lead frame, wherein clip members attached to the contact areas and corresponding foot members remain in the lead frame.

2. The method of claim 1, wherein the selected support members extend from the at least one foot member to both sides of the SIL hybrid circuit, each of the selected support members being longer than the at least one foot member.

3. The method of claim 1, further comprising bending a selected support member towards the base substrate, the bending enabling the selected support member to be positioned into a corresponding hole formed in the base substrate.

4. The method of claim 3, wherein a bent portion of the selected support member is twisted around a longitudinal axis of the support member.

5. The method of claim 4, wherein the bent portion of the selected support member is twisted about 45 degrees around the longitudinal axis of the support member.

6. The method of claim 4, further comprising bending a second selected support member at opposite sides of the hybrid circuit, the bent portions of each of the selected support members being twisted in opposite directions.

7. The method of claim 3, wherein the selected support member is configured, when inserted into a hole, to grip the hole.

8. The method of claim 1, wherein the base substrate comprises a printed circuit board.

9. The method of claim 1, wherein the support members comprise a strip-like member.

* * * * *